(12) United States Patent
Hong et al.

(10) Patent No.: US 11,901,363 B2
(45) Date of Patent: Feb. 13, 2024

(54) RESISTANCE MEASURING STRUCTURES OF STACKED DEVICES

(71) Applicant: Samsung Electronics Co., Ltd., Suwon-si (KR)

(72) Inventors: Byounghak Hong, Albany, NY (US); Seunghyun Song, Albany, NY (US); Myunggil Kang, Hwaseong-si (KR); Kang-Ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 254 days.

(21) Appl. No.: 17/382,149

(22) Filed: Jul. 21, 2021

(65) Prior Publication Data
US 2022/0367521 A1 Nov. 17, 2022

Related U.S. Application Data

(60) Provisional application No. 63/188,508, filed on May 14, 2021.

(51) Int. Cl.
| | |
|---|---|
| *H01L 27/12* | (2006.01) |
| *H01L 23/535* | (2006.01) |
| *H01L 29/423* | (2006.01) |
| *H01L 29/786* | (2006.01) |
| *H01L 21/8238* | (2006.01) |
| *H01L 21/822* | (2006.01) |
| *H01L 27/06* | (2006.01) |
| *H01L 27/092* | (2006.01) |
| *G01R 27/02* | (2006.01) |

(52) U.S. Cl.
CPC ......... *H01L 27/1203* (2013.01); *G01R 27/02* (2013.01); *H01L 23/535* (2013.01); *H01L 27/1211* (2013.01)

(58) Field of Classification Search
CPC ............... H01L 27/1203; H01L 23/535; H01L 27/1211; H01L 29/42392; H01L 29/78681; H01L 29/78684; H01L 29/78696; H01L 21/823871; H01L 21/8221; H01L 21/823807; H01L 21/823814; H01L 22/32; H01L 27/0688; H01L 27/092

See application file for complete search history.

(56) References Cited

U.S. PATENT DOCUMENTS

| | | |
|---|---|---|
| 7,586,135 B2 | 9/2009 | Kwon et al. |
| 7,602,028 B2 | 10/2009 | Son et al. |
| 7,998,851 B2 | 8/2011 | Son et al. |

(Continued)

*Primary Examiner* — Herve-Louis Y Assouman
(74) *Attorney, Agent, or Firm* — Myers Bigel, P.A.

(57) ABSTRACT

Resistance measuring structures for a stacked integrated circuit device are provided. The resistance measuring structures may include a first Complementary Field Effect Transistor (CFET) stack, a second CFET stack, and a conductive connection. The first CFET may include a first upper transistor that includes a first upper drain region and a first lower transistor that is between the substrate and the first upper transistor and includes a first lower drain region. The second CFET may include a second upper transistor that includes a second upper drain region and a second lower transistor that is between the substrate and the second upper transistor and includes a second lower drain region. The conductive connection may electrically connect the first upper drain region and the second upper drain region.

18 Claims, 11 Drawing Sheets

(56) References Cited

U.S. PATENT DOCUMENTS

| | | |
|---|---|---|
| 8,237,228 B2 | 8/2012 | Or-Bach et al. |
| 10,910,312 B2 | 2/2021 | Rubin et al. |
| 2003/0136978 A1* | 7/2003 | Takaura ................ H10B 10/00 257/210 |
| 2021/0391302 A1* | 12/2021 | Kao ........................ H01L 24/08 |

* cited by examiner

RESISTANCE MEASURING STRUCTURES OF STACKED DEVICES

CROSS-REFERENCE TO RELATED APPLICATION

This application claims priority to U.S. Provisional Application Ser. No. 63/188,508, entitled RESISTANCE MEASUREMENT MACRO FOR 3D STACKED DEVICES, filed in the USPTO on May 14, 2021, the disclosure of which is hereby incorporated by reference herein in its entirety.

FIELD

The present disclosure generally relates to the field of electronics and, more particularly, to integrated circuit devices including stacked transistors.

BACKGROUND

Integrated circuit devices including stacked transistors, such as a complementary field effect transistor (CFET) stack, were introduced to reduce their area, and performance of those integrated circuit devices may depend on resistances of conductive elements (e.g., conductive elements formed through middle-of-line (MOL) processes).

SUMMARY

According to some embodiments of the present invention, resistance measuring structures may include a first CFET stack, a second CFET stack, and a conductive connection. The first CFET may include a first upper transistor that includes a first upper drain region and a first lower transistor that is between the substrate and the first upper transistor and includes a first lower drain region. The second CFET may include a second upper transistor that includes a second upper drain region and a second lower transistor that is between the substrate and the second upper transistor and includes a second lower drain region. The conductive connection may electrically connect or may contact the first upper drain region and the second upper drain region.

According to some embodiments of the present invention, resistance measuring structures may include a first CFET stack and a second CFET stack. The first CFET may include a first upper transistor that includes a first upper drain region and a first lower transistor that is between the substrate and the first upper transistor and includes a first lower drain region. The second CFET may include a second upper transistor that includes a second upper drain region and a second lower transistor that is between the substrate and the second upper transistor and includes a second lower drain region. The first upper drain region, the first lower drain region, the second upper drain region, and the second lower drain region may be electrically connected to each other.

According to some embodiments of the present invention, resistance measuring structures may include a first CFET stack, a second CFET stack, and a conductive connection on a substrate. The first CFET may include a first upper transistor that includes a first upper drain region and a first lower transistor that is between the substrate and the first upper transistor and includes a first lower drain region. The second CFET may include a second upper transistor that includes a second upper drain region and a second lower transistor that is between the substrate and the second upper transistor and includes a second lower drain region. The conductive connection may contact the substrate, the first upper drain region, the first lower drain region, the second upper drain region, and the second lower drain region.

DETAILED DESCRIPTION

According to some embodiments of the present invention, resistance measuring structures for a stacked integrated circuit device are provided. The stacked integrated circuit device may be a single integrated circuit chip that includes multiple CFET stacks, each of which includes a N-type transistor and a P-type transistor stacked on a substrate. The resistance measuring structure may include two CFET stacks and may be included in the stacked integrated circuit device. The stacked integrated circuit device may include multiple resistance measuring structures.

Figure 1:
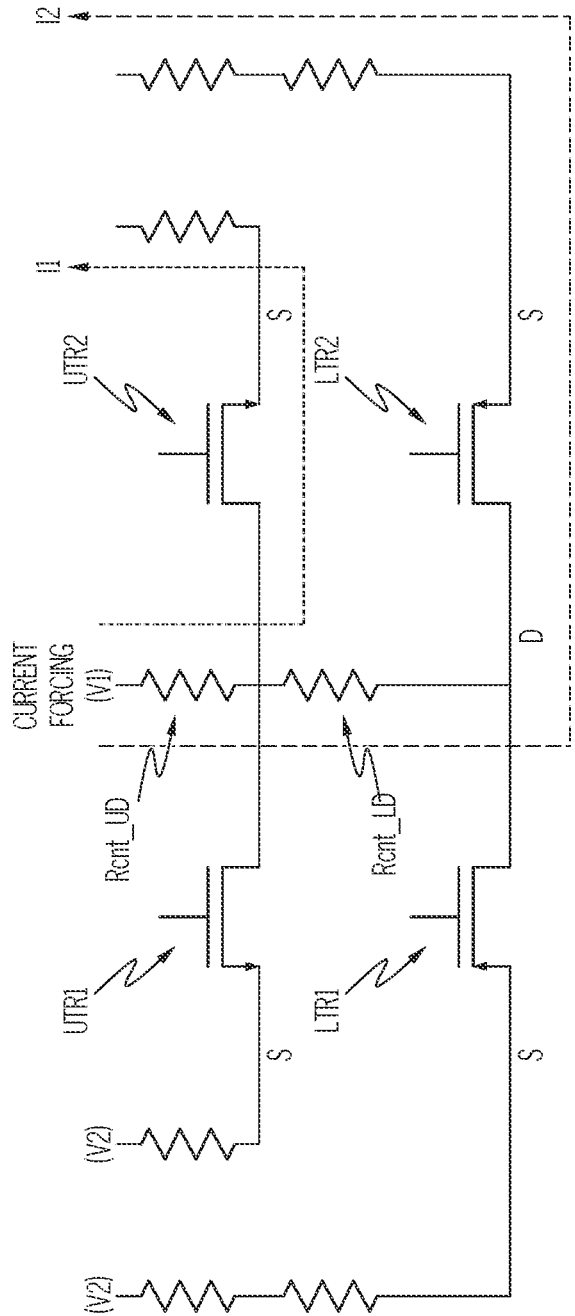
FIG. 1 is a circuit diagram of a resistance measuring structure according to some embodiments of the present invention.

FIG. 1 is a circuit diagram of a resistance measuring structure 1000 according to some embodiments of the present invention. The resistance measuring structure 1000 can be used to measure an upper drain contact resistance Rcnt_UD and a lower drain contact resistance Rcnt_LD.

Referring to FIG. 1, the resistance measuring structure 1000 may include a first CFET stack including a first lower transistor LTR1 and a first upper transistor UTR1 and may include a second CFET stack including a second lower transistor LTR2 and a second upper transistor UTR2. In some embodiments, each of the first lower transistor LTR1 and the second lower transistor LTR2 may be a N-type transistor, and each of the first upper transistor UTR1 and the second upper transistor UTR2 may be a P-type transistor as illustrated in FIG. 1. Alternatively, in some embodiments, each of the first lower transistor LTR1 and the second lower transistor LTR2 may be a P-type transistor, and each of the first upper transistor UTR1 and the second upper transistor UTR2 may be a N-type transistor.

Drain regions of all four transistors (i.e., the first lower transistor LTR1, the first upper transistor UTR1, the second lower transistor LTR2, and the second upper transistor UTR2) may be electrically connected to each other. Those drain regions may be electrically connected to a current source for current forcing and may be also electrically connected to a first probe of a voltage meter. In some embodiments, the drain regions are electrically connected to each other through a conductive connection (e.g., a first conductive connection 32_1 in FIG. 3). A source region of the first upper transistor UTR1 or a source region of the first lower transistor LTR1 may be electrically connected to a second probe of the voltage meter. A source region of the second upper transistor UTR2 or a source region of the second lower transistor LTR2 may be electrically connected to a current sensing circuit to measure a current (e.g., I1 or I2).

To obtain an upper drain contact resistance Rcnt_UD, the source region of the first upper transistor UTR1 may be electrically connected to the second probe of the voltage meter, the source region of the second upper transistor UTR2 may be electrically connected to a current sensing circuit to measure a current I1 flowing through the second upper transistor UTR2, and the first upper transistor UTR1 and the second upper transistor UTR2 may be turned on by applying an appropriate gate voltage thereto. The first lower transistor LTR1 and the second lower transistor LTR2 may remain turned off. The upper drain contact resistance Rcnt_UD may be a resistance of an upper portion of the conductive connection (e.g., a first conductive connection 32_1 in FIG. 3) that contacts the drain regions (e.g., a first upper drain region 26UD_1 and a second upper drain region 26UD_2 in FIG. 3) of the first upper transistor UTR1 and the second upper transistor UTR2. The upper drain contact resistance Rcnt_UD can be calculated by Equation 1.

$$Rcnt\_UD = (V1-V2)/I1 \qquad \text{Equation 1:}$$

V1-V2 is a voltage measured by the voltage meter.

To obtain a lower drain contact resistance Rcnt_LD, the source region of the first lower transistor LTR1 may be electrically connected to the second probe of the voltage meter, the source region of the second lower transistor LTR2 may be electrically connected to a current sensing circuit to measure a current I2 flowing through the second lower transistor LTR2, and first lower transistor LTR1 and the second lower transistor LTR2 may be turned on by applying an appropriate gate voltage thereto. The first upper transistor UTR1 and the second upper transistor UTR2 may remain turned off. The lower drain contact resistance Rcnt_LD may be a resistance of a lower portion of the conductive connection (e.g., a first conductive connection 32_1 in FIG. 3) that contacts the drain regions (e.g., a first lower drain region 26LD_1 and a second lower drain region 26LD_2 in FIG. 3) of the first lower transistor LTR1 and the second lower transistor LTR2. The lower drain contact resistance Rcnt_LD can be calculated by Equation 2.

$$Rcnt\_LD = (V1-V2)/I2 - Rcnt\_UD \qquad \text{Equation 2:}$$

V1-V2 is a voltage measured by the voltage meter.

Figure 2:
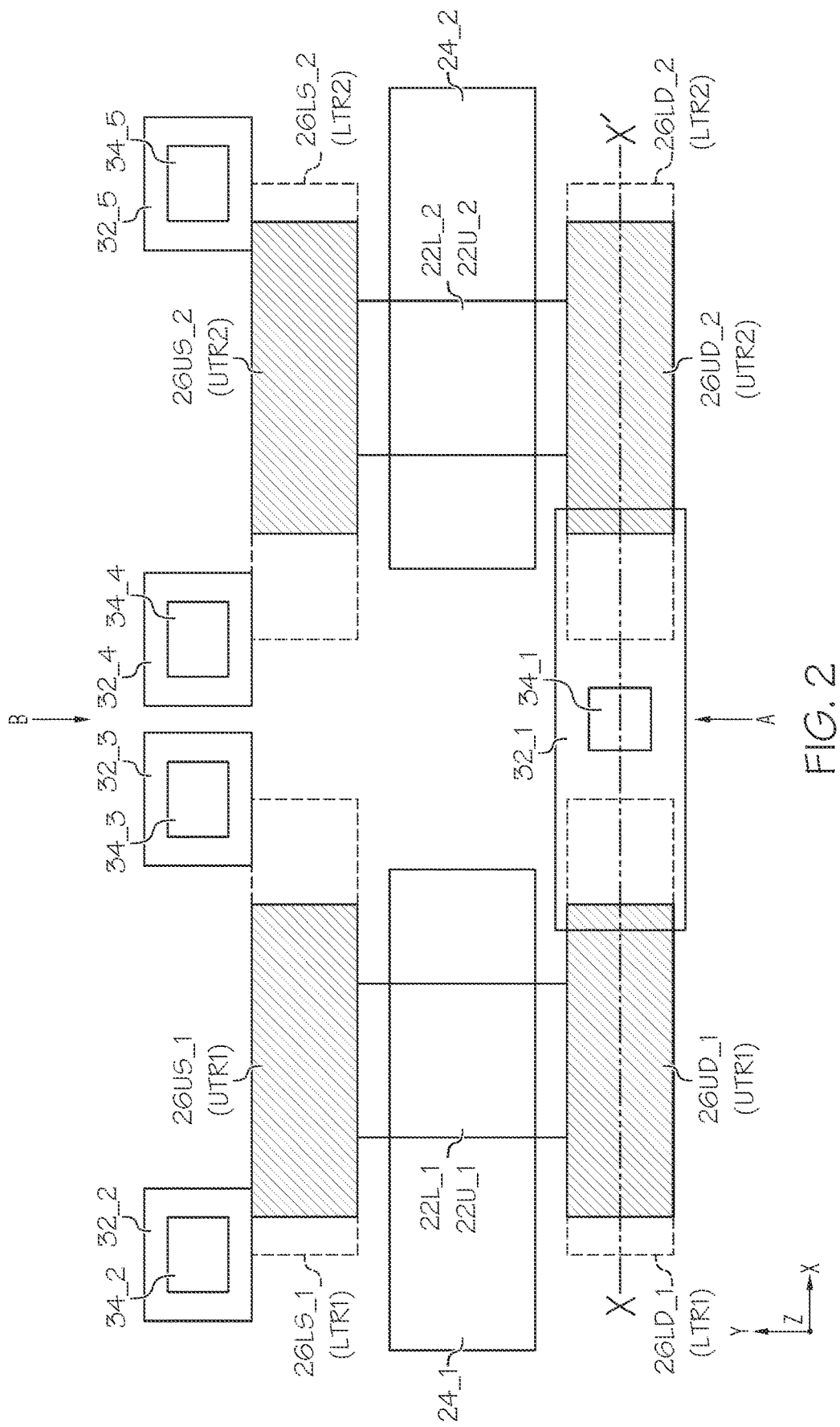
FIG. 2 is a plan view of the resistance measuring structure in FIG. 1 according to some embodiments of the present invention.
Figure 3:
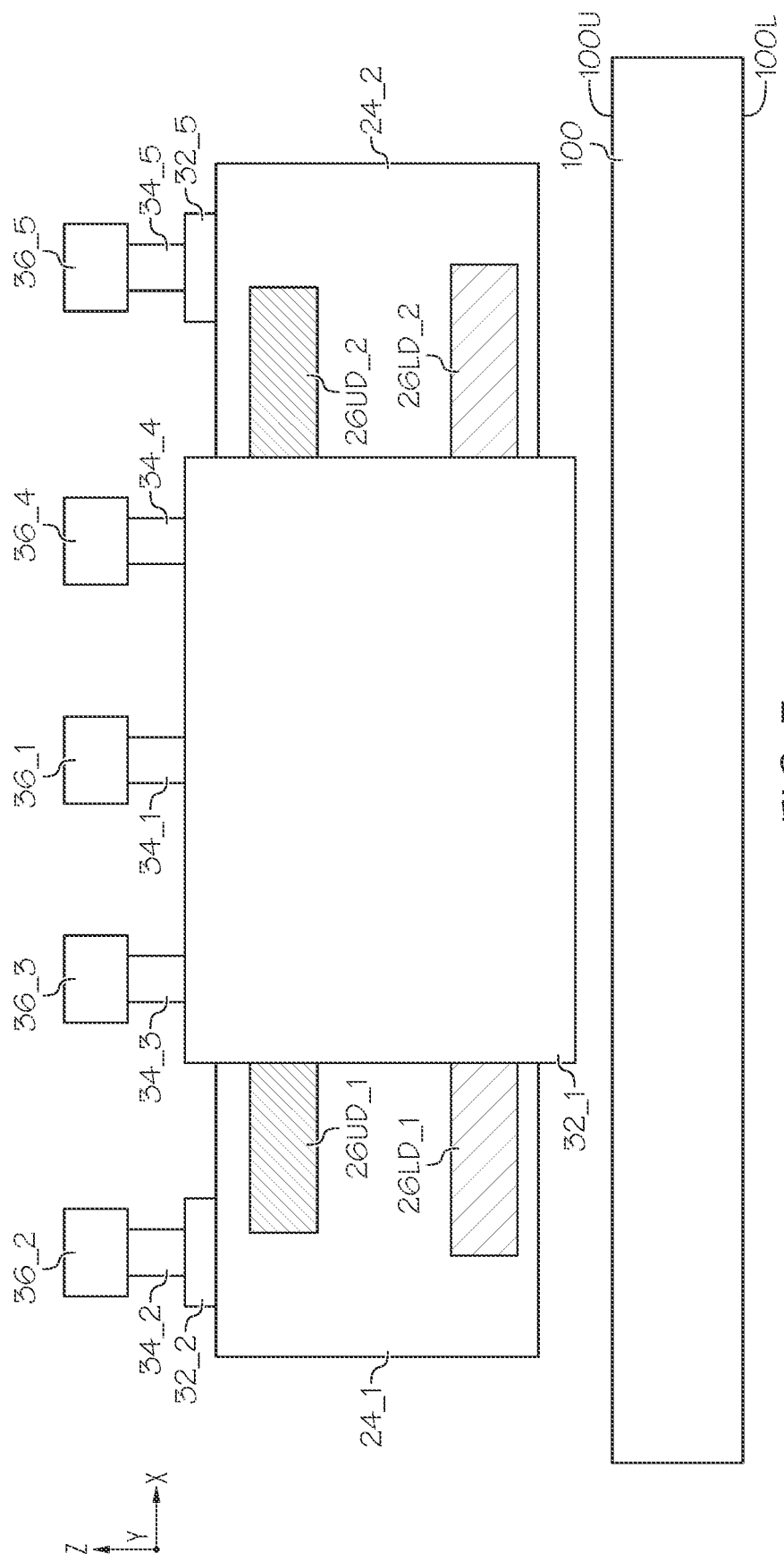
FIGS. 3 and 4 are side views of the resistance measuring structure in FIG. 2 according to some embodiments of the present invention.
Figure 4:
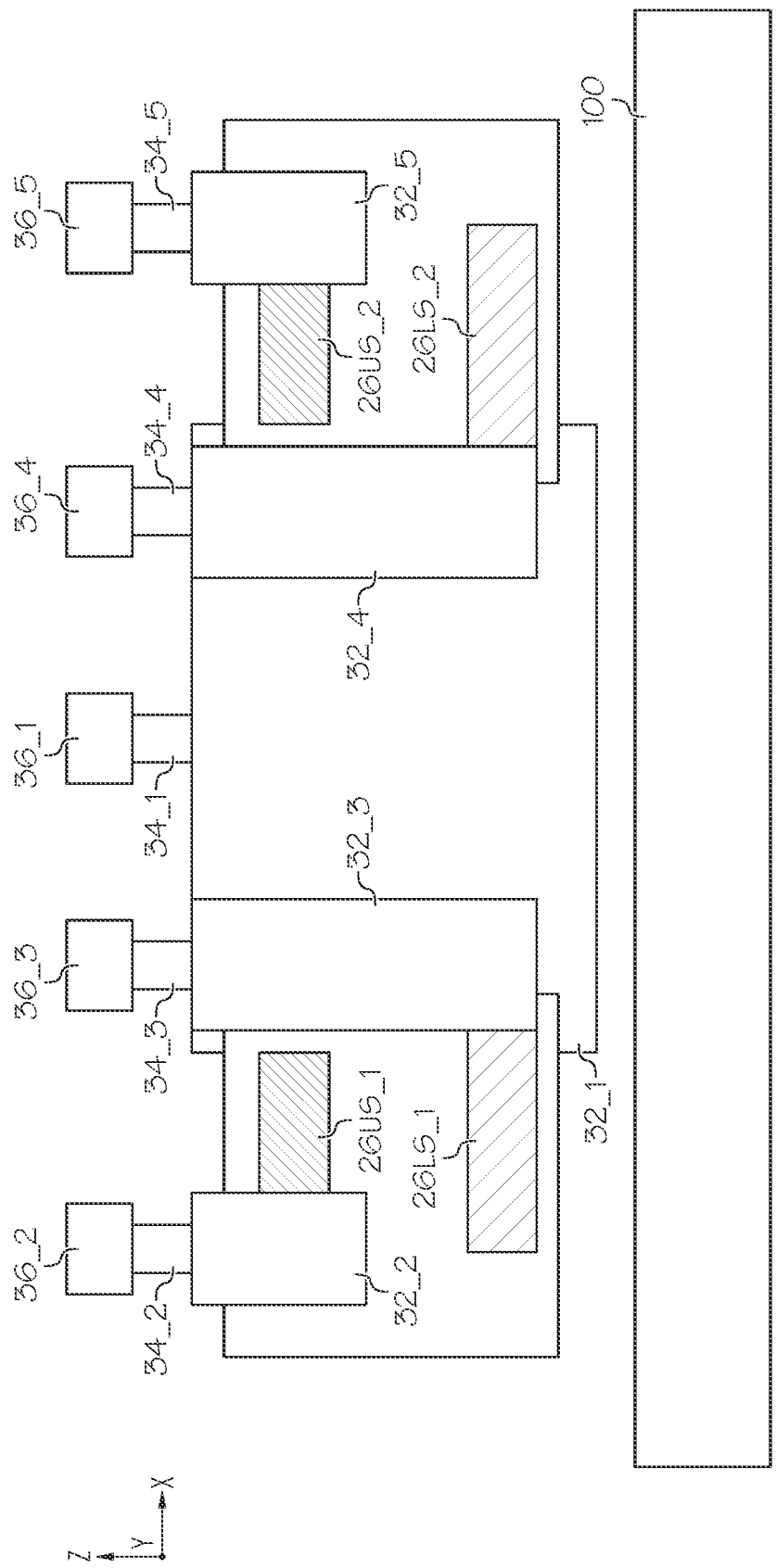

FIG. 2 is a plan view of the resistance measuring structure 1000 in FIG. 1 according to some embodiments of the present invention, and FIGS. 3 and 4 are side views of the resistance measuring structure 1000 from viewpoints A and B in FIG. 2, respectively. For simplicity of illustration, wires (i.e., first through fifth wires 36_1, 36_2, 36_3, 36_4, and 36_5 in FIGS. 3 and 4) are not shown in FIG. 2.

Referring to FIGS. 2 through 4, the resistance measuring structure 1000 may include a first lower transistor LTR1, a first upper transistor UTR1, a second lower transistor LTR2, and a second upper transistor UTR2 on a substrate 100. The first lower transistor LTR1 may include a first lower drain region 26LD_1, a first lower source region 26LS_1 and a first lower active region 22L_1 between the first lower drain region 26LD_1 and the first lower source region 26LS_1. The first upper transistor UTR1 may include a first upper drain region 26UD_1, a first upper source region 26US_1 and a first upper active region 22U_1 between the first upper drain region 26UD_1 and the first upper source region 26US_1. The first upper drain region 26UD_1 may overlap the first lower drain region 26LD_1 in a vertical direction (a Z direction) that may be perpendicular to an upper surface 100U of the substrate 100, and the first upper source region 26US_1 may overlap the first lower source region 26LS_1 in the vertical direction. The first lower drain region 26LD_1 and the first lower source region 26LS_1 may be spaced apart from each other in a second horizontal direction (a Y direction) that may be parallel to the upper surface 100U of the substrate 100. As used herein, "an element A overlapping an element B in a vertical direction" (or similar language) means that at least one vertical line can be drawn that intersects both elements A and B. Each of the first upper active region 22U_1 and the first lower active region 22L_1 may be a nanosheet, a nano wire or a fin-shaped active region. In some embodiments, the first upper active region 22U_1 may be a fin-shaped active region, and the first lower active region 22L_1 may be a nanosheet.

A first gate structure 24_1 may be provided between the first lower drain region 26LD_1 and the first lower source region 26LS_1 and between the first upper drain region 26UD_1 and the first upper source region 26US_1 and may surround at least portion of each of the first lower active region 22L_1 and the first upper active region 22U_1. The first gate structure 24_1 may include a gate dielectric layer and a gate electrode.

The second lower transistor LTR2 may include a second lower drain region 26LD_2, a second lower source region 26LS_2 and a second lower active region 22L_2. The second upper transistor UTR2 may include a second upper drain region 26UD_2, a second upper source region 26US_2 and a second upper active region 22U_2. A second gate structure 24_2 may be provided between the second lower drain region 26LD_2 and the second lower source region 26LS_2 and between the second upper drain region 26UD_2 and the second upper source region 26US_2. Spatial relationships and configurations of elements of the second lower transistor LTR2 and the second upper transistor UTR2 may be the same as or similar to those of the first lower transistor LTR1 and the first upper transistor UTR1.

The first lower transistor LTR1 may be between the substrate 100 and the first upper transistor UTR1, and the second lower transistor LTR2 may be between the substrate 100 and the second upper transistor UTR2. The first lower transistor LTR1 may be spaced apart from the second lower transistor LTR2 in a first horizontal direction (an X direction) that may be parallel to the upper surface 100U of the substrate 100 and may traverse the second horizontal direction. The first upper transistor UTR1 may be spaced apart from the second upper transistor UTR2 in the first horizontal direction. In some embodiments, the first horizontal direction may be perpendicular to the second horizontal direction.

In some embodiments, the first lower drain region 26LD_1, the first upper drain region 26UD_1, the second lower drain region 26LD_2 and the second upper drain region 26UD_2 are electrically connected to each other through a first conductive connection 32_1. The first conductive connection 32_1 may contact the first lower drain region 26LD_1, the first upper drain region 26UD_1, the second lower drain region 26LD_2 and the second upper drain region 26UD_2 as illustrated in FIGS. 2 and 3. A first via contact 34_1 and a first wire 36_1 may be sequentially stacked on the first conductive connection 32_1. The first conductive connection 32_1 may be electrically connected to the first wire 36_1 through the first via contact 34_1. The first wire 36_1 may be electrically connected to a current source and a first probe of a voltage meter.

The resistance measuring structure 1000 may also include a second conductive connection 32_2, a third conductive connection 32_3, a fourth conductive connection 32_4, and a fifth conductive connection 32_5, which contact the first upper source region 26US_1, the first lower source region 26LS_1, the second lower source region 26LS_2, and the second upper source region 26US_2, respectively. Each of the second through the fifth conductive connections 32_2, 32_3, 32_4, and 32_5 may be electrically connected to a corresponding wire (i.e., a second wire 36_2, a third wire 36_3, a fourth wire 36_4, or a fifth wire 36_5) through a via contact (i.e., a second via contact 34_2, a third via contact 34_3, a fourth via contact 34_4, or a fifth via contact 34_5).

To obtain the upper drain contact resistance Rcnt_UD, the first upper source region 26US_1 may be electrically connected to a second probe of a voltage meter through the second wire 36_2, and the second upper source region 26US_2 may be electrically connected to a current sensing circuit through the fifth wire 36_5 to measure a current (i.e., a current I1 in FIG. 1) flowing through the second upper transistor UTR2. To obtain the lower drain contact resistance Rcnt_LD, the first lower source region 26LS_1 may be electrically connected to a second probe of a voltage meter through the third wire 36_3, and the second lower source region 26LS_2 may be electrically connected to a current sensing circuit through the fourth wire 36_4 to measure a current (i.e., a current I2 in FIG. 1) flowing through the second lower transistor LTR2.

For example, the substrate 100 may include a semiconductor material (e.g., silicon, germanium, silicon-germanium) and/or a III-V semiconductor compounds (e.g., GaI), GaAs, GaSb). In some embodiments, the substrate 100 may be a semiconductor-on-insulator substrate (e.g., such as a silicon-on-insulator (SOL) substrate or a germanium-on-insulator (GOI) substrate). As used herein the term "and/or" includes any and all combinations of one or more of the associated listed items. The first to fifth conductive connections 32_1 to 32_5, the first to fifth via contacts 34_1 to 34_5, and the first to fifth wires 36_1 to 36_5 may include a conductive material such as metal (e.g., titanium, aluminum), metal alloy, and/or a nitride or carbide of the metal.

Figure 5:
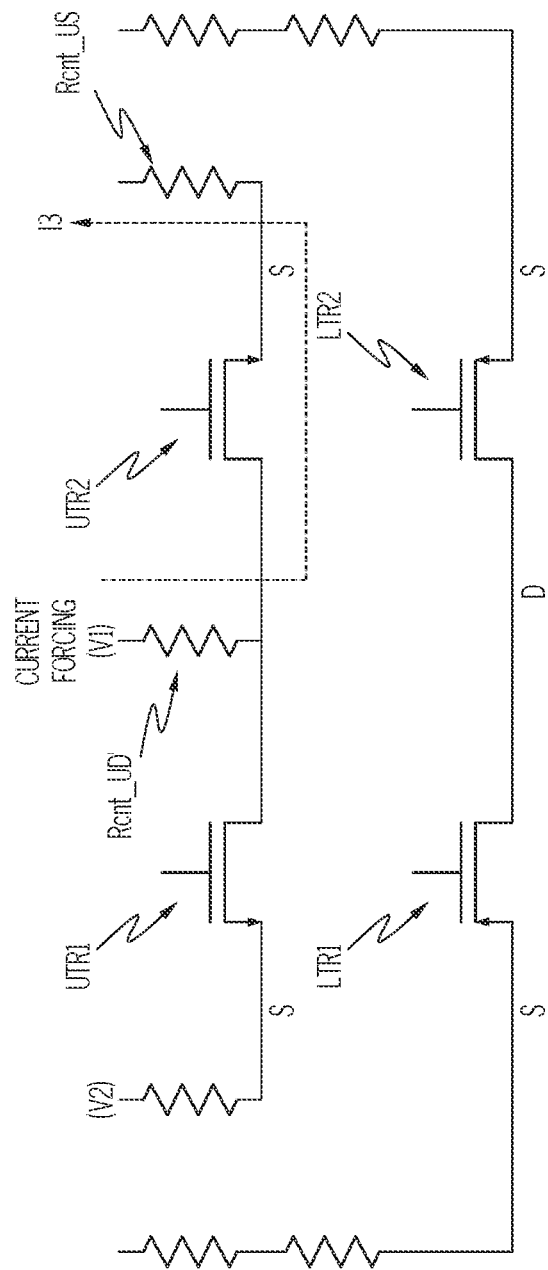
FIG. 5 is a circuit diagram of a resistance measuring structure according to some embodiments of the present invention.

FIG. 5 is a circuit diagram of a resistance measuring structure 2000 according to some embodiments of the present invention. The resistance measuring structure 2000 can be used to measure an upper source contact resistance Rcnt_US.

Unlike the resistance measuring structure 1000, in the resistance measuring structure 2000, drain regions of the first lower transistor LTR1 and the second lower transistor LTR2 are not electrically connected to drain regions of the first upper transistor UTR1 and the second upper transistor UTR2, and thus an upper drain contact resistance Rcnt_UD' and an upper source contact resistance Rcnt_US may have an equal value. Accordingly, both the upper drain contact resistance Rcnt_UD' and the upper source contact resistance Rcnt_US can be obtained by electrically connecting the drain regions of the first upper transistor UTR1 and the second upper transistor UTR2 to a current source and a first probe of a voltage meter, turning on the first upper transistor UTR1 and the second upper transistor UTR2, and electrically connecting the source region of the first upper transistor UTR1 to a second probe of the voltage meter. The upper drain contact resistance Rcnt_UD' and the upper source contact resistance Rcnt_US can be calculated by Equation 3.

$$Rcnt\_UD' \text{ and } Rcnt\_US = (V1-V2)/I3 \qquad \text{Equation 3:}$$

I3 refers to a current flowing through the second upper transistor UTR2, and V1-V2 is a voltage measured by the voltage meter.

Figure 6:
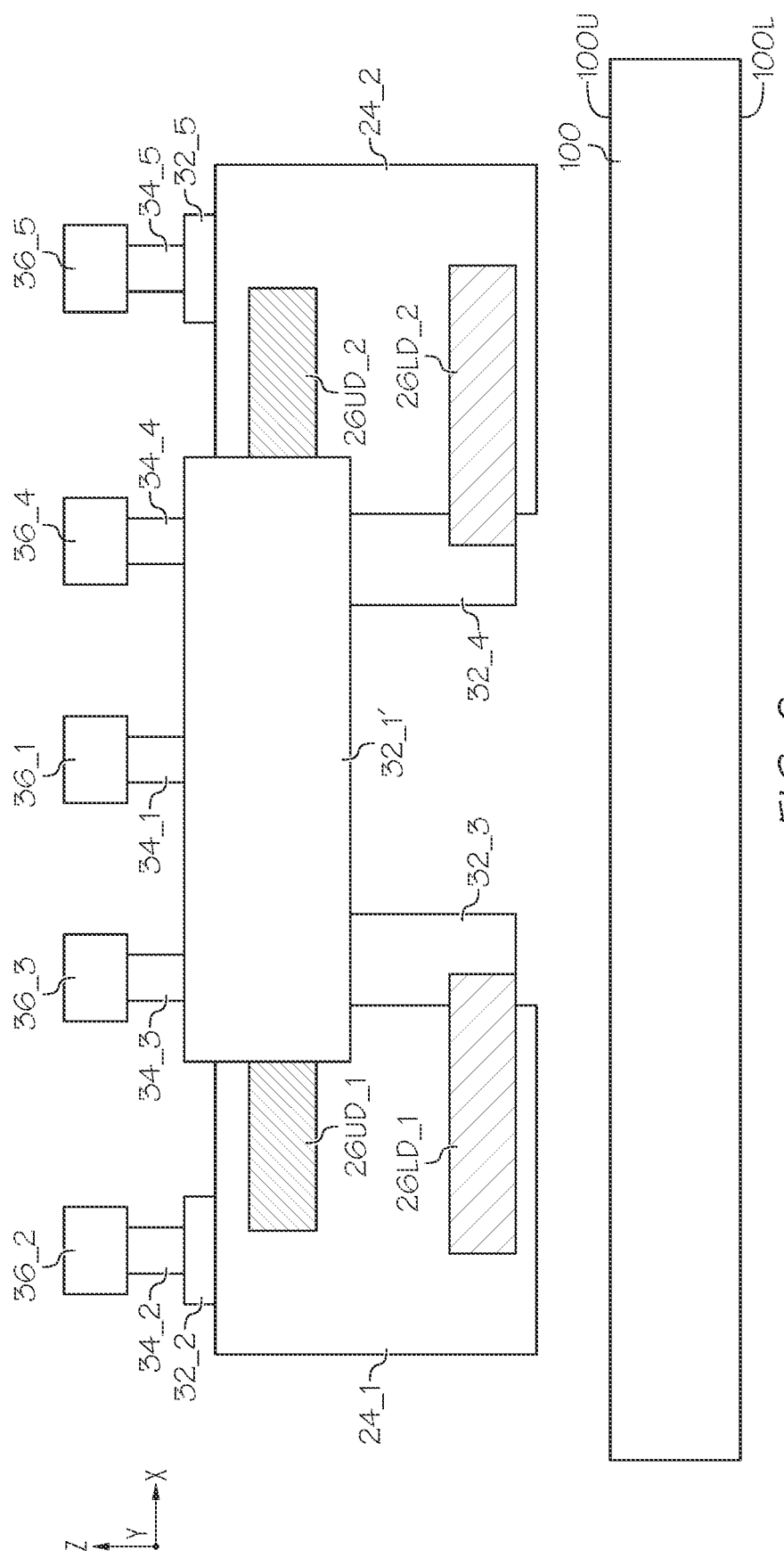
FIGS. 6 and 7 are side views of the resistance measuring structure in FIG. 5 according to some embodiments of the present invention.
Figure 7:
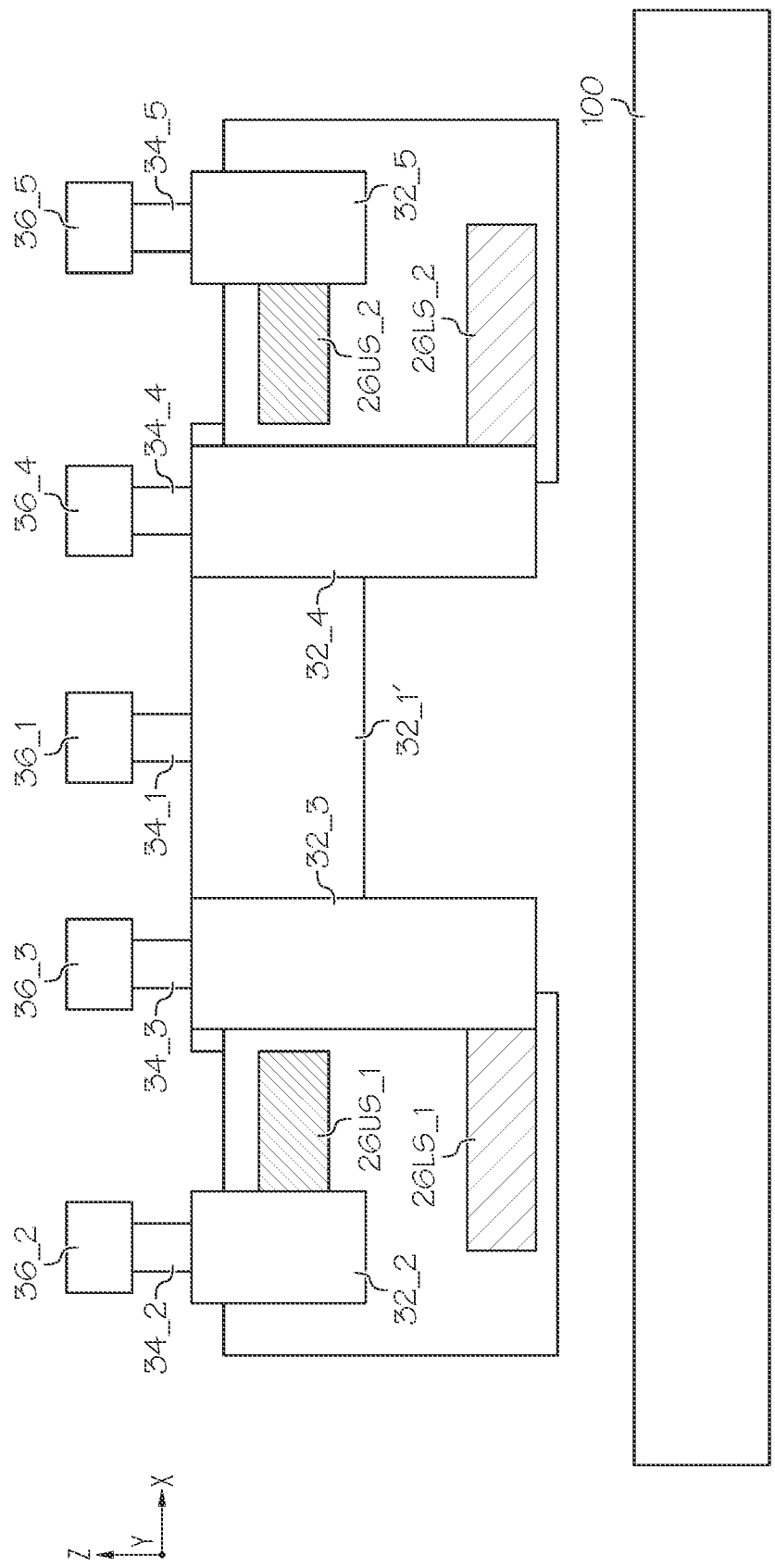

A plan view of the resistance measuring structure 2000 in FIG. 5 may be similar to the plan view shown in FIG. 2. FIGS. 6 and 7 are side views of the resistance measuring structure 2000 of FIG. 5 from viewpoints A and B in FIG. 2, respectively. The resistance measuring structure 2000 illustrated in FIGS. 6-7 may be similar to the resistance measuring structure 1000 illustrated in FIGS. 3-4 except for a thickness of a first conductive connection 32_1'.

Referring to FIGS. 6 and 7, in some embodiments, a first conductive connection 32_1' may contact the first upper drain region 26UD_1 and the second upper drain region 26UD_2 and may be spaced apart from the first lower drain region 26LD_1 and the second lower drain region 26LD_2 in the vertical direction. As illustrated in in FIG. 6, a lower end of the first conductive connection 32_1' may be spaced apart from upper ends of the first lower drain region 26LD_1 and the second lower drain region 26LD_2 in the vertical direction. In some embodiments, the first conductive connection 32_1', the second conductive connection 32_2, and the fifth conductive connection 32_5 may have an equal thickness in the vertical direction as illustrated in FIG. 7.

To obtain the upper drain contact resistance Rcnt_UD' and the upper source contact resistance Rcnt_US, the first upper drain region 26UD_1 and the second upper drain region 26UD_2 may be electrically connected to a current source and a first probe of a voltage meter through the first wire 36_1, the first upper source region 26US_1 may be electrically connected to a second probe of the voltage meter through the second wire 36_2, and the second upper source region 26US_2 may be electrically connected to a current sensing circuit through the fifth wire 36_5 to measure a current (i.e., a current I3 in FIG. 5) flowing through the second upper transistor UTR2.

Figure 8:
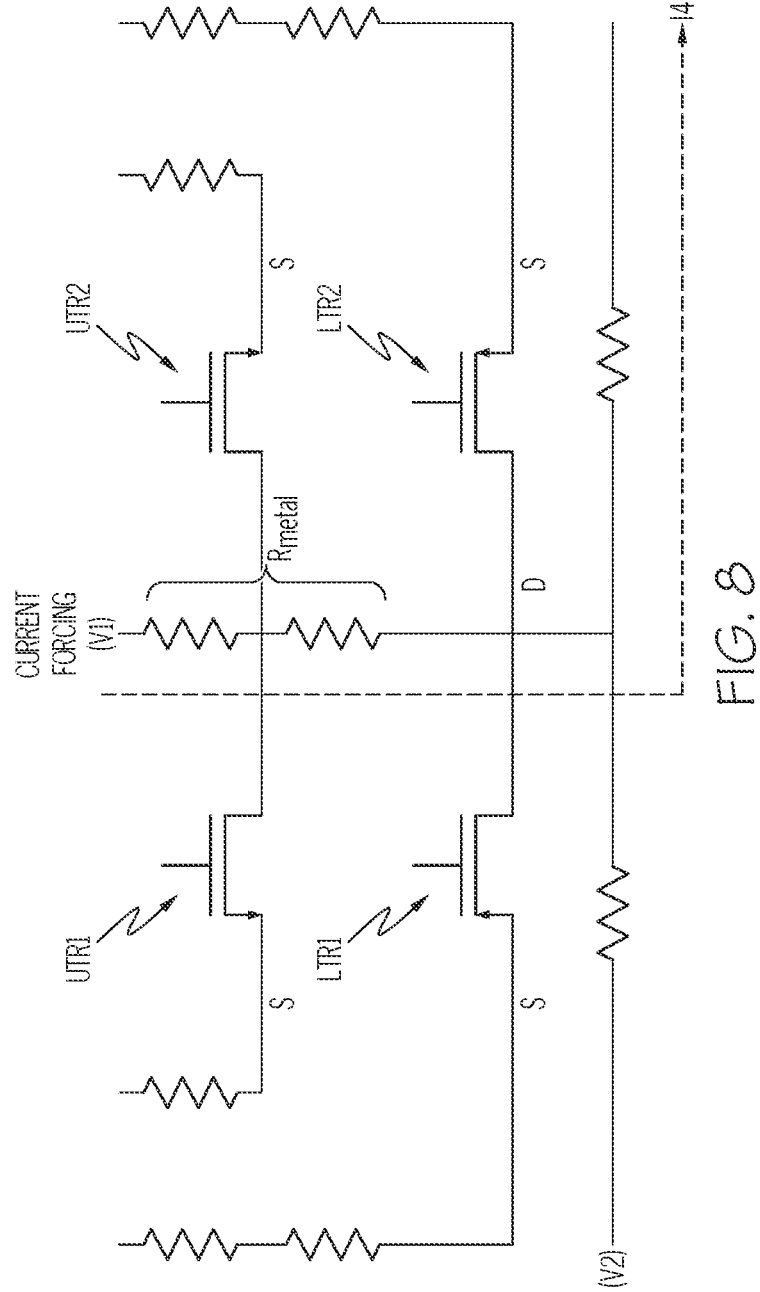
FIG. 8 is a circuit diagram of a resistance measuring structure according to some embodiments of the present invention.

FIG. 8 is a circuit diagram of a resistance measuring structure 3000 according to some embodiments of the present invention. The resistance measuring structure 3000 can be used to obtain a resistance of a metal layer Rmetal (e.g., a metal layer 33 in FIG. 11) of a conductive connection (e.g., a first conductive connection 32_1" in FIG. 11).

Figure 9:
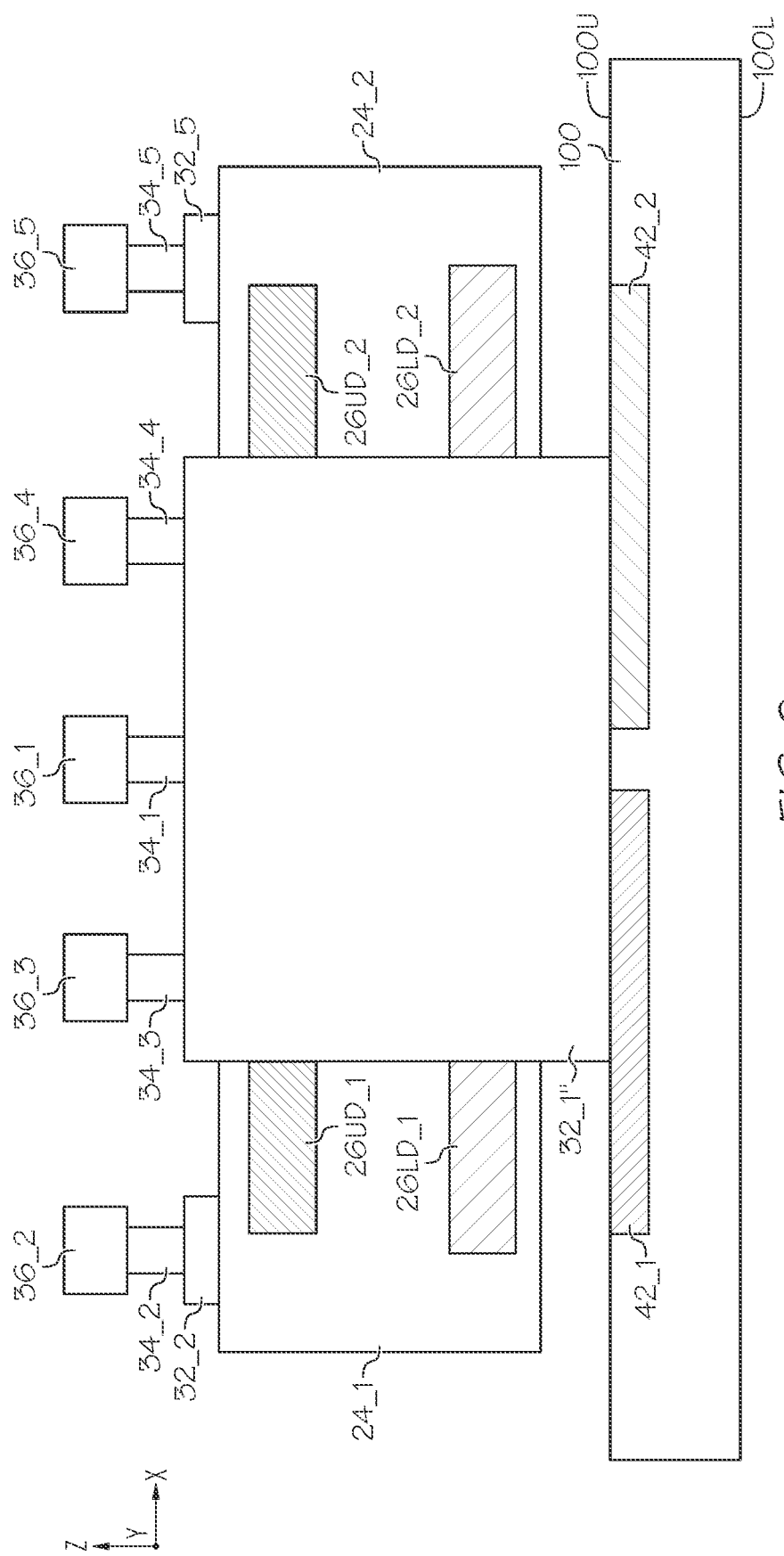
FIGS. 9 and 10 are side views of the resistance measuring structure in FIG. 8 according to some embodiments of the present invention.
Figure 10:
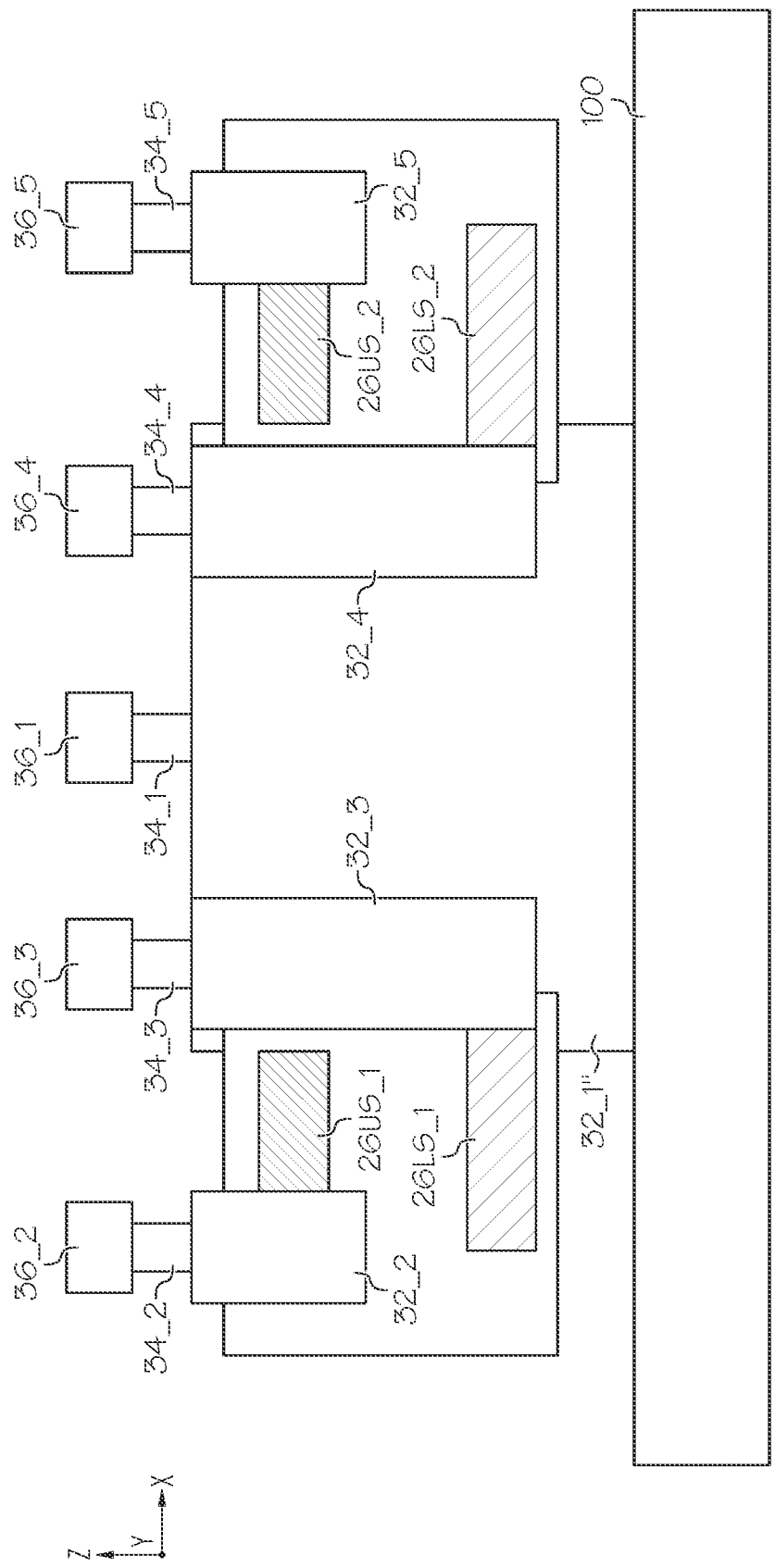
Figure 11:
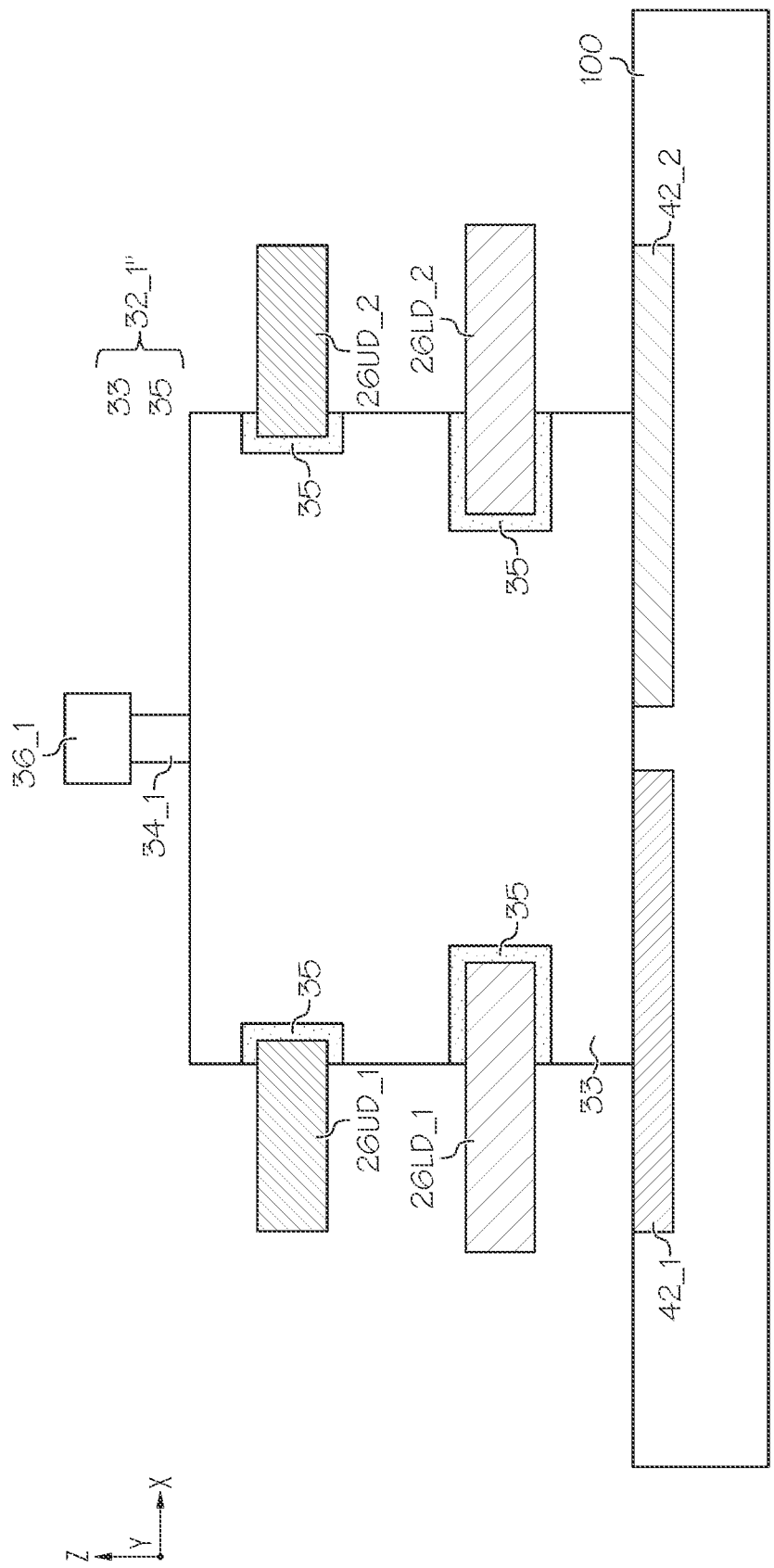
FIG. 11 is a cross-sectional view of the resistance measuring structure in FIG. 8 according to some embodiments of the present invention.

A plan view of the resistance measuring structure 3000 in FIG. 8 may be similar to the plan view in FIG. 2. FIGS. 9 and 10 are side views of the resistance measuring structure 3000 of FIG. 8 from viewpoints A and B in FIG. 2, respectively. FIG. 11 is a cross-sectional view of the resistance measuring structure 3000 taken along the line X-X' in FIG. 2.

Referring to FIGS. 8-11, the resistance measuring structure 3000 may be similar to the resistance measuring structure 1000 with primary differences being that a second node of a voltage meter is electrically connected to a first lower wire 42_1, rather than one of source regions of the first lower transistor LTR1 and the first upper transistor UTR1, and a current I4 flows through a second lower wire 42_2, rather than through one of the second lower transistor LTR2 and the second upper transistor UTR2.

The resistance Rmetal of the metal layer can be obtained by electrically connecting the drain regions (i.e., the first lower drain region 26LD_1, the first upper drain region 26UD_1, the second lower drain region 26LD_2 and the second upper drain region 26UD_2) to a current source and a first probe of a voltage meter through the first wire 36_1, electrically connecting the first lower wire 42_1 to a second probe of the voltage meter and electrically connecting the second lower wire 42_2 to current sensing circuit to measure a current I4. The resistance Rmetal of the metal layer can be calculated by Equation 4.

$$R\text{metal}=(V1-V2)/I4 \quad \text{Equation 4:}$$

Referring to FIGS. 9 and 10, the first lower wire 42_1 and the second lower wire 42_2 may be formed in the substrate 100. Each of the first lower wire 42_1 and the second lower wire 42_2 may be a conductor. In some embodiments, each of the first lower wire 42_1 and the second lower wire 42_2 may be formed by implanting impurities into the substrate 100. In some embodiments, each of the first lower wire 42_1 and the second lower wire 42_2 may include metal (e.g., titanium, aluminum), metal alloy, and/or a nitride or carbide of the metal. The first conductive connection 32_1" may contact the substrate 100, the first lower drain region 26LD_1, the first upper drain region 26UD_1, the second lower drain region 26LD_2 and the second upper drain region 26UD_2 and may be electrically connected to the first lower wire 42_1 and the second lower wire 42_2. In some embodiments, the first conductive connection 32_1" may contact the first lower wire 42_1 and the second lower wire 42_2 as illustrated in FIG. 9.

Referring to FIG. 11, in some embodiments, the first conductive connection 32_1" may include a metal layer 33 and silicide layers 35. Each of the silicide layers 35 may be between the metal layer 33 and a respective one of the first lower drain region 26LD_1, the first upper drain region 26UD_1, the second lower drain region 26LD_2 and the second upper drain region 26UD_2. The metal layer 33 may include a single monolithic layer. For example, the metal layer 33 may be a tungsten layer, a copper layer, or an aluminum layer. The current I4 does not flow through the first lower transistor LTR1, the first upper transistor UTR1, the second lower transistor LTR2, and the second upper transistor UTR2 and thus Rmetal is a resistance of the metal layer 33.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to plan views, cross-sectional views, and side views that are schematic illustrations of idealized embodiments and are provided to illustrate spatial relationships and electrical connections between elements. The present invention, however, is not limited to the shapes and dimensions of those elements illustrated in those views. Variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents and shall not be restricted or limited by the foregoing detailed description.

What is claimed is:

1. A resistance measuring structure comprising:
   a first Complementary Field Effect Transistor (CFET) stack on a substrate, the first CFET stack comprising:
      a first upper transistor comprising a first upper drain region; and
      a first lower transistor between the substrate and the first upper transistor, the first lower transistor comprising a first lower drain region;
   a second CFET stack on the substrate, the second CFET stack comprising:
      a second upper transistor comprising a second upper drain region; and
      a second lower transistor between the substrate and the second upper transistor, the second lower transistor comprising a second lower drain region; and
   a conductive connection that contacts the first upper drain region and the second upper drain region,
   wherein the conductive connection contacts the first lower drain region and the second lower drain region.

2. The resistance measuring structure of claim 1, wherein the first upper drain region and the second upper drain region are spaced apart from each other in a first horizontal direction that is parallel to an upper surface of the substrate, and the first upper transistor further comprises a first upper source region, and the first upper drain region and the first upper source region are spaced apart from each other in a second horizontal direction that is parallel to the upper surface of the substrate and traverses the first horizontal direction.

3. The resistance measuring structure of claim 1, wherein the first upper transistor further comprises a first upper source region, and the first lower transistor further comprises a first lower source region,
the conductive connection is configured to be electrically connected to a current source and is further configured to be electrically connected to a first probe of a voltage meter, and
the first upper source region or the first lower source region is configured to be electrically connected to a second probe of the voltage meter.

4. The resistance measuring structure of claim 1, wherein the first upper transistor further comprises a first upper source region, and
the conductive connection is configured to be electrically connected to a current source and is further configured to be electrically connected to a first probe of a voltage meter, and the first upper source region is configured to be electrically connected to a second probe of the voltage meter.

5. The resistance measuring structure of claim 1, wherein the conductive connection is a first conductive connection, and the second upper transistor further comprises a second upper source region, and
the resistance measuring structure further comprises a second conductive connection that contacts the second upper source region.

6. The resistance measuring structure of claim 1, wherein the conductive connection contacts the first upper drain region, the second upper drain region and the substrate.

7. The resistance measuring structure of claim 6, wherein the conductive connection is a first conductive connection, and the resistance measuring structure further comprises a second conductive connection that is in the substrate and is electrically connected to the first conductive connection.

8. The resistance measuring structure of claim 7, wherein the first conductive connection is configured to be electrically connected to a current source and is further configured to be electrically connected to a first probe of a voltage meter, and the second conductive connection is configured to be electrically connected to a second probe of the voltage meter.

9. A resistance measuring structure comprising:
a first Complementary Field Effect Transistor (CFET) stack on a substrate, the first CFET stack comprising:
a first upper transistor comprising a first upper drain region; and
a first lower transistor between the substrate and the first upper transistor, the first lower transistor comprising a first lower drain region;
a second CFET stack on the substrate, the second CFET stack comprising:
a second upper transistor comprising a second upper drain region; and
a second lower transistor between the substrate and the second upper transistor, the second lower transistor comprising a second lower drain region,
wherein the first upper drain region, the first lower drain region, the second upper drain region, and the second lower drain region are electrically connected to each other.

10. The resistance measuring structure of claim 1, wherein the conductive connection is configured to be electrically connected to a current source and is further configured to be electrically connected to a first probe of a voltage meter.

11. The resistance measuring structure of claim 9, wherein the first upper drain region and the second upper drain region are spaced apart from each other in a first horizontal direction that is parallel to an upper surface of the substrate, and
the first upper transistor further comprises a first upper source region, and the first upper drain region and the first upper source region are spaced apart from each other in a second horizontal direction that is parallel to the upper surface of the substrate and traverses the first horizontal direction.

12. The resistance measuring structure of claim 9, wherein the first upper drain region, the first lower drain region, the second upper drain region, and the second lower transistor are electrically connected to each other through a conductive connection.

13. The resistance measuring structure of claim 12, wherein the first upper transistor further comprises a first upper source region, and the first lower transistor further comprises a first lower source region,
the conductive connection is configured to be electrically connected to a current source and is further configured to be electrically connected to a first probe of a voltage meter, and
the first upper source region or the first lower source region is configured to be electrically connected to a second probe of the voltage meter.

14. The resistance measuring structure of claim 9, wherein the first upper drain region overlaps the first lower drain region in a vertical direction that is perpendicular to an upper surface of the substrate, and the second upper drain region overlaps the second lower drain region in the vertical direction.

15. A resistance measuring structure comprising:
a first Complementary Field Effect Transistor (CFET) stack on a substrate, the first CFET stack comprising:
a first upper transistor comprising a first upper drain region; and
a first lower transistor between the substrate and the first upper transistor, the first lower transistor comprising a first lower drain region;
a second CFET stack on the substrate, the second CFET stack comprising:
a second upper transistor comprising a second upper drain region; and
a second lower transistor between the substrate and the second upper transistor, the second lower transistor comprising a second lower drain region; and
a first conductive connection that contacts the substrate, the first upper drain region, the first lower drain region, the second upper drain region, and the second lower drain region.

16. The resistance measuring structure of claim 15 further comprising a second conductive connection that is in the substrate and is electrically connected to first conductive connection.

17. The resistance measuring structure of claim 16, wherein the first conductive connection is configured to be electrically connected to a current source and is further configured to be electrically connected to a first probe of a voltage meter, and the second conductive connection is configured to be electrically connected to a second probe of the voltage meter.

18. The resistance measuring structure of claim 15, wherein the first upper drain region overlaps the first lower drain region in a vertical direction that is perpendicular to an upper surface of the substrate, and the second upper drain region overlaps the second lower drain region in the vertical direction.

\* \* \* \* \*